(12) United States Patent
Sakamoto et al.

(10) Patent No.: US 8,196,843 B2
(45) Date of Patent: Jun. 12, 2012

(54) MULTI-LAYER PIEZOELECTRIC ELEMENT, INJECTION APPARATUS USING THE SAME AND METHOD OF MULTI-LAYER PIEZOELECTRIC ELEMENT

(75) Inventors: Takami Sakamoto, Kirishima (JP); Masahiro Inagaki, Kirishima (JP); Harald-Johannes Kastl, Fichtelberg (DE); Carsten Schuh, Baldham (DE); Bernhard Doellgast, Deutschlandsberg (AT); Atsushi Ochi, Yokohama (JP)

(73) Assignees: Kyocera Corporation, Kyoto (JP); Siemens Aktiengesellschaft, Munich (DE)

( * ) Notice: Subject to any disclaimer, the term of this patent is extended or adjusted under 35 U.S.C. 154(b) by 280 days.

(21) Appl. No.: 12/532,606

(22) PCT Filed: Mar. 27, 2007

(86) PCT No.: PCT/JP2007/057337
§ 371 (c)(1),
(2), (4) Date: Dec. 7, 2009

(87) PCT Pub. No.: WO2008/117476
PCT Pub. Date: Oct. 2, 2008

(65) Prior Publication Data
US 2010/0090033 A1    Apr. 15, 2010

(51) Int. Cl.
*B05B 17/04* (2006.01)

(52) U.S. Cl. .......... 239/4; 239/102.2; 310/363; 310/368
(58) Field of Classification Search .......... 239/4, 102.1, 239/102.2; 310/328, 363, 368
See application file for complete search history.

(56) References Cited

U.S. PATENT DOCUMENTS

| | | | |
|---|---|---|---|
| 6,394,363 B1 * | 5/2002 | Arnott et al. | 239/102.1 |
| 7,140,554 B2 * | 11/2006 | Chang | 239/102.2 |
| 7,358,655 B2 | 4/2008 | Ragossnig et al. | 310/358 |
| 7,420,319 B2 | 9/2008 | Kastl et al. | 310/363 |
| 7,554,251 B2 | 6/2009 | Kondo et al. | 310/366 |
| 2006/0181178 A1 | 8/2006 | Kastl et al. | 310/328 |
| 2006/0238073 A1 | 10/2006 | Ragossnig et al. | 310/328 |
| 2007/0278907 A1 | 12/2007 | Kondo et al. | 310/364 |
| 2009/0224636 A1 | 9/2009 | Kondo et al. | 310/366 |

FOREIGN PATENT DOCUMENTS

| | | |
|---|---|---|
| DE | 102 34 787 C1 | 10/2003 |
| DE | 103 07 825 A1 | 9/2004 |
| EP | 1 732 146 A1 | 12/2006 |
| JP | 64-041285 | 2/1989 |

* cited by examiner

*Primary Examiner* — Steven J Ganey
(74) *Attorney, Agent, or Firm* — DLA Piper LLP (US)

(57) ABSTRACT

A multi-layer piezoelectric element having higher durability which experience less decrease in the amount of displacement even when operated continuously over a long period of time under a high pressure and a high voltage is provided. The multi-layer piezoelectric element comprises a plurality of piezoelectric layers and a plurality of internal electrode layers, wherein the piezoelectric layers and the internal electrode layers are stacked alternately one on another, and at least one of the plurality of internal electrode layers contains at least one nitride, titanium nitride or zirconium nitride.

2 Claims, 5 Drawing Sheets

MULTI-LAYER PIEZOELECTRIC ELEMENT, INJECTION APPARATUS USING THE SAME AND METHOD OF MULTI-LAYER PIEZOELECTRIC ELEMENT

CROSS-REFERENCE TO THE RELATED APPLICATIONS

This application is a national stage of international application No. PCT/JP2007/057337 filed on Mar. 27, 2007, the entire content of which is incorporated herein by reference.

TECHNICAL FIELD

The present invention relates to a multi-layer piezoelectric element and an injection apparatus using the same mounted in, for example, fuel injection apparatus of automobile engine, liquid injection apparatus of ink jet printer or a precision positioning device or a vibration preventing device for an optical apparatus.

BACKGROUND ART

Multi-layer piezoelectric elements mounted on the fuel injection apparatus of automobile engine or the like have been known. FIG. 5A is a perspective view showing the multi-layer piezoelectric element of the prior art. The multi-layer piezoelectric element 101 comprises a stack 109 made by stacking a plurality of piezoelectric layers 105 and a plurality of internal electrode layers (metal layers) 107 which are stacked alternately one on another, and a pair of external electrodes 111 formed on the side faces of the stack 109.

The internal electrode layers 107 are not formed over the entire principal surface of the piezoelectric layer 105, and have the so-called partial electrode structure. FIG. 5B is an exploded perspective view explanatory of the partial electrode structure showing a part of the multi-layer piezoelectric element 101 shown in FIG. 5A. As shown in FIGS. 5A and 5B, the internal electrode layers 107 are stacked so as to be exposed on either side face of the stack 109 alternately in every other layer. Accordingly, the plurality of internal electrode layers 107 are electrically connected to the pair of external electrodes 105 alternately. The stack 109 has inactive layers 113 stacked on both ends of the stack 109 in the stacking direction.

In the multi-layer piezoelectric element which has the partial electrode structure shown in FIGS. 5A and 5B, there are an active region A in which the internal electrode layers 107 of different polarities oppose each other via the piezoelectric layers 105, and an inactive region B in which the internal electrode layers 107 of different polarities do not oppose each other via the piezoelectric layers 105. Accordingly, when the multi-layer piezoelectric element is operated, since only the active region A undergoes displacement and the inactive region B does not undergo displacement, stress may be concentrated in the border between the active region A and the inactive region B and become the start point of crack.

As shown in FIG. 5A, the multi-layer piezoelectric element 101 has the inactive layers 113 stacked on both ends thereof in the stacking direction. When the multi-layer piezoelectric element is operated, since the inactive region B does not undergo displacement, stress may be concentrated in the border between the region which undergoes displacement and the inactive layers 113 and become the start point of crack.

Such a crack as described above may grow from the border toward the side faces of the stack 109 (the inactive region B side), but also may grow toward the inside of the stack 109 (the active region A side). When an electric field is applied between the opposing internal electrode layers 107, the active layer A expands in the direction of the electric field by reverse piezoelectric effect and shrinks in the direction perpendicular to the direction of the electric field. When the piezoelectric layers 105 expand in the direction of the electric field, the element 101 expands in the stacking direction as a whole. In case the element 101 is housed in a casing or a frame which restricts the expansion, the element 101 receives a compressive force as a reaction.

A crack which starts in the border and grows toward the active region A may run in the direction of thickness of the piezoelectric layers 105 while bending and branching in accordance to the state of stress. When a crack growing in the direction of thickness of the piezoelectric layers 105 is generated between the internal electrode layers 107 which oppose each other, there has been such a problem that short-circuiting occurs between the internal electrode layers 107, thus resulting in a decrease in the amount of displacement of the multi-layer piezoelectric element 101.

In recent years, it is a common practice to operate the multi-layer piezoelectric element continuously over a long period of time with a higher electric field applied, since it is required to achieve a large amount of displacement from a compact multi-layer piezoelectric element under a higher pressure. To meet these requirements, multi-layer piezoelectric elements having stress relieving layer provided inside thereof have been proposed (refer to, for example, DE10234787A1 and DE10307825A1). However, there have been demands for a multi-layer piezoelectric element which has higher durability under conditions of continuous operation over a long period of time with a high pressure.

DISCLOSURE OF THE INVENTION

An object of the present invention is to provide a multi-layer piezoelectric element and an injection apparatus having higher durability which experience less decrease in the amount of displacement even when operated continuously over a long period of time under a high pressure and a high voltage.

The multi-layer piezoelectric element of the present invention comprises a plurality of piezoelectric layers and a plurality of internal electrode layers, wherein the piezoelectric layers and the internal electrode layers are stacked alternately one on another, and at least one of the plurality of internal electrode layers contains at least one nitride, titanium nitride or zirconium nitride.

It is preferable that the internal electrode layer containing the nitride has a plurality of hollows or aperture in a face which opposite to the piezoelectric layer.

It is preferable that there are plurality of the internal electrode layers which contain the nitride, and that the internal electrode layers are disposed in ordered arrangement along the stacking direction of the stack.

The injection apparatus of the present invention comprises a container which has an injection hole and the multi-layer piezoelectric element described above, wherein a liquid which fills the container is discharged through the injection hole by the operation of the multi-layer piezoelectric element.

The multi-layer piezoelectric element of the present invention has such effects as described below, since at least one of the plurality of internal electrode layers contains at least one of titanium nitride and zirconium nitride. Titanium nitride and zirconium nitride have low wettability with piezoelectric particles that constitute the piezoelectric layers and particles that constitute the internal electrode layers. Therefore, strength of the internal electrode layers can be made lower and bonding strength between the piezoelectric layers and the internal electrode layers can be made lower. Since the internal electrode layers clamp the piezoelectric layers which undergo displacement during operation, addition of the nitride makes it possible to decrease the force of the internal electrode layers which restricts the piezoelectric layers. This makes it possible to not only increase the amount of displacement of the multi-layer piezoelectric element but also improve durability in operation over a long period of time.

In addition, the internal electrode layer containing the nitride has a plurality of hollows or aperture in a face which opposite to the piezoelectric layer, which decreases a contact area between the internal electrode layer and the piezoelectric layer, lowering a restriction in which the internal electrode layer restricts the piezoelectric layer.

DESCRIPTION OF REFERENCE NUMERALS

Figure 1A:
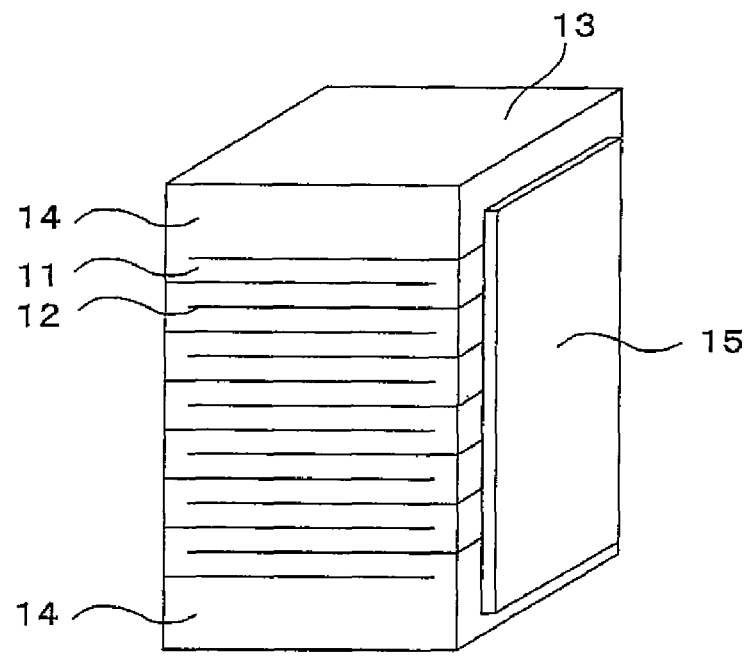
FIG. 1A is a perspective view showing the multi-layer piezoelectric element according to one embodiment of the present invention.

11: piezoelectric layer
12: internal electrode layer
12a: other internal electrode layer
12b: internal electrode layer containing at least one of TiN and ZrN
13: stack
14: inactive layer
15: external electrode
16a: hollow
16b: aperture
16c: hollow
31: container
33: injection hole
35: valve
37: fuel passage
39: cylinder
41: piston
43: piezoelectric actuator

BEST MODE FOR CARRYING OUT THE INVENTION

<Multi-Layer Piezoelectric Element>

Figure 1B:
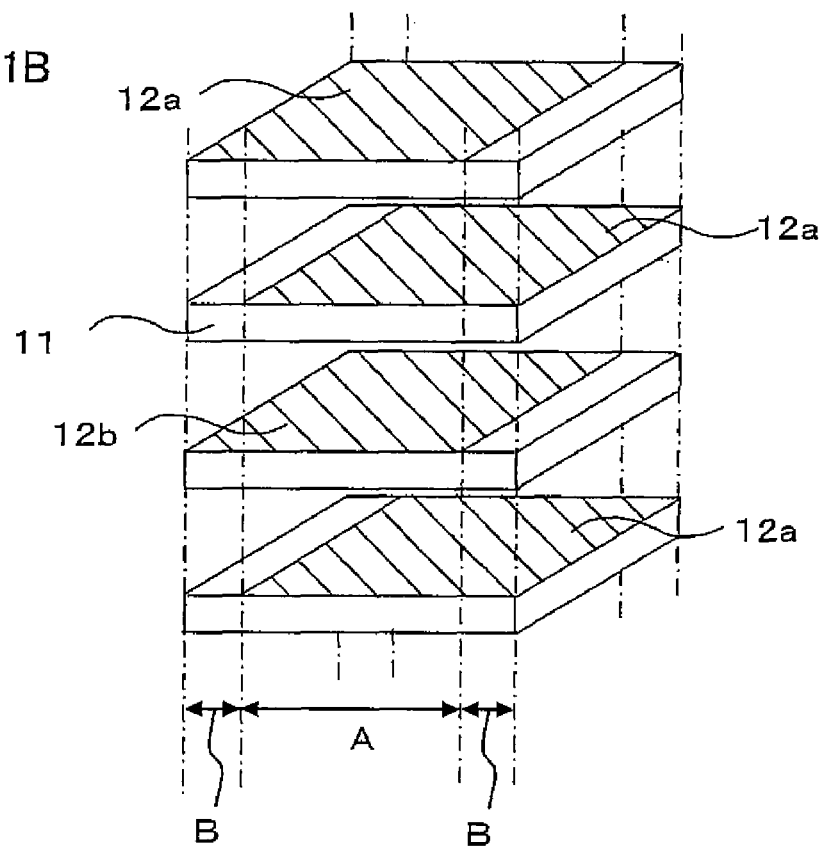
FIG. 1B is an exploded perspective view showing a part of the multi-layer piezoelectric element explanatory of the internal structure of the multi-layer piezoelectric element shown in FIG. 1A.
Figure 2:
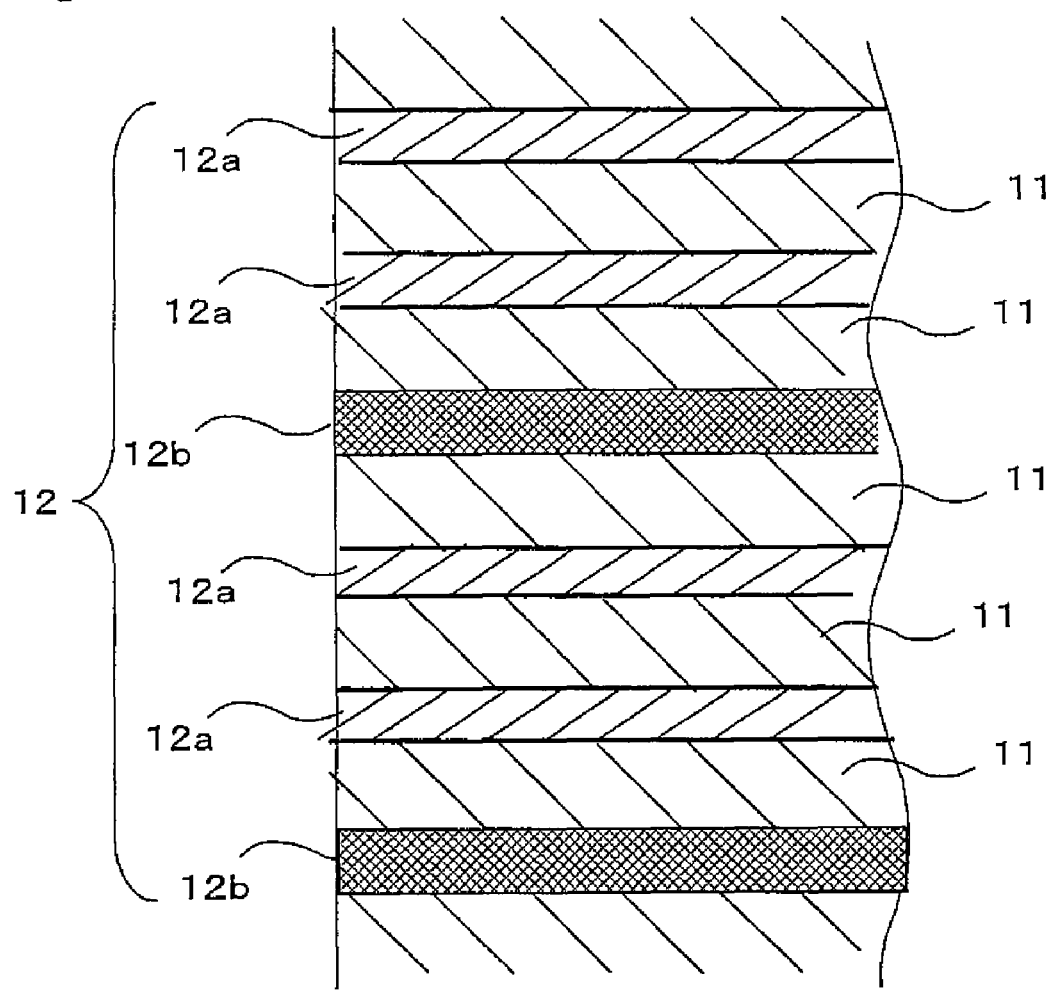
FIG. 2 is an enlarged sectional view of a part of the multi-layer piezoelectric element according to the embodiment shown in FIG. 1A.

The multi-layer piezoelectric element according to one embodiment of the present invention will now be described in detail. FIG. 1A is a perspective view showing the multi-layer piezoelectric element according to this embodiment. FIG. 1B is an exploded perspective view showing a part of the multi-layer piezoelectric element explanatory of the internal structure of the multi-layer piezoelectric element shown in FIG. 1A. FIG. 2 is an enlarged sectional view of a part of the multi-layer piezoelectric element according to this embodiment.

As shown in FIGS. 1A, 1B, the multi-layer piezoelectric element of this embodiment comprises a stack 13 made by stacking a plurality of piezoelectric layers 11 and a plurality of internal electrode layers 12 which are stacked alternately one on another, and a pair of external electrodes 15 are formed on the side faces of the stack 13 which oppose each other (one of the external electrodes is not shown). The internal electrode layer 12 is not formed over the entire principal surface of the piezoelectric layer 11, and has the so-called partial electrode structure. The plurality of internal electrode layers 12 having the partial electrode structure are disposed so as to be exposed on either of the opposing side faces of the stack 13 in every other layer. Accordingly, the internal electrode layers 12 are electrically connected to the pair of external electrodes 15 alternately. The external electrodes 15 may also be provided on side faces which are adjacent to each other.

Provided on both ends of the stack 13 in the stacking direction are inactive layers 14, 14 formed from a piezoelectric material. When the multi-layer piezoelectric element is used as a piezoelectric actuator, lead wires may be connected to the pair of external electrodes 15 by soldering, with the lead wires connected to a power source provided outside. When a predetermined voltage is applied from the outside power source between the internal electrode layers 12 adjacent to each other, the piezoelectric layers 11 undergo displacement by the reverse piezoelectric effect. The inactive layers 14 do not undergo displacement even when a voltage is applied, since the internal electrode layers 12 are provided only on one principal surface and the internal electrode layers 12 are not provided on the other principal surface.

As shown in FIG. 2, the multi-layer piezoelectric element of this embodiment is characterized in that at least one of the plurality of internal electrode layers 12 contains at least one of titanium nitride (TiN) and zirconium nitride (ZrN). The internal electrode layers which contain such a nitride will hereinafter be referred to as the nitride containing internal electrode layers 12b and the internal electrode layers except for the nitride containing internal electrode layers 12b will hereinafter be referred to as the nitride electrode layers 12a.

TiN and ZrN are nitrides which have high electrical conductivity, and have low wettability with the piezoelectric particles that constitute the piezoelectric layers 11 and the metal particles that constitute the internal electrode layers 12. Therefore, the strength of the nitride containing internal electrode layers 12b can be made lower and bonding strength between the piezoelectric layers 11 and the nitride containing internal electrode layers 12b can be made lower without decreasing the electrical conductivity of the nitride containing internal electrode layers 12b, by adding TiN and/or ZrN to the internal electrode layers.

The internal electrode layers 12 restrict the displacement of the piezoelectric layers 11 during operation. Thus the force of the nitride containing internal electrode layers 12b, having TiN and/or ZrN added thereto, which restricts the piezoelectric layers 11 is made lower. This increases the amount of displacement of the element. Also because the force which restricts the piezoelectric layers 11 is smaller, the stress acting on the element is mitigated in the interface between the nitride containing internal electrode layers 12b and the piezoelectric layers 11. When there are plurality of nitride containing internal electrode layers 12b, the stress acting on the element can be dispersed. While concentration of stress suppresses the displacement of the element, the suppressing effect is reduced as the stress is dispersed so that the element can undergo displacement without being suppressed. As the effect of stress relieving and the effect of stress dispersion are combined, the amount of displacement of the multi-layer piezoelectric element is increased further and, at the same time, durability during long-term operation is improved further.

When the multi-layer piezoelectric element is subjected to a high transient surge voltage due to a noise in the power source, or the multi-layer piezoelectric element is operated continuously over a long period of time under conditions of high temperature, high humidity, high electric field and a high pressure, oxidization of the internal electrode layers 12 can be suppressed, as the nitride described above are oxidized prior to the oxidization of the metal component which is the main component of the internal electrode layers 12, thus protecting the internal electrode layers.

Since the nitride particles have low wettability with the metal particles that constitute the nitride containing internal electrode layers 12b as the main component, crack (peel-off) tends to occur in the interface between the nitride particles and the metal particles. Also because the nitride particles have low wettability with the piezoelectric particles that constitute the piezoelectric layers 11, too, cracks propagate only in the interface between the nitride particles and the piezoelectric layers 11, thus suppressing propagating the cracks in the piezoelectric layers 11. Specifically, since cracks occur in the nitride containing internal electrode layers 12b or in the interface with the piezoelectric layers 11, which suppresses such crack that penetrates the piezoelectric layers 11 in the stacking direction, a short-circuiting between the internal electrode layers 12 can be suppressed.

When the element is subjected to stress, the stress can be absorbed as peel-off occurs in the interface between the nitride particles and the metal particles that constitute the nitride containing internal electrode layers 12b. Also when the element is subjected to stress, the stress can also be absorbed as the nitride particles break. When stress is concentrated in a part of the multi-layer piezoelectric element, a phenomenon similar to that described above occurs, so that cracks occur between the nitride particles and the metal particles that are the main component of the nitride containing internal electrode layers 12b that are bonded together with a lower strength. As the cracks occur in the nitride containing internal electrode layers 12b and such a crack that penetrates the piezoelectric layers 11 in the stacking direction can be suppressed, so that short-circuiting between the internal electrode layers 12 can be suppressed.

In addition, the nitride containing internal electrode layer 12b has a plurality of hollows or apertures in a face which opposite to the neighboring piezoelectric layer 11. It is supposed that a forming mechanism the hollows or the apertures is follow.

Figure 3:
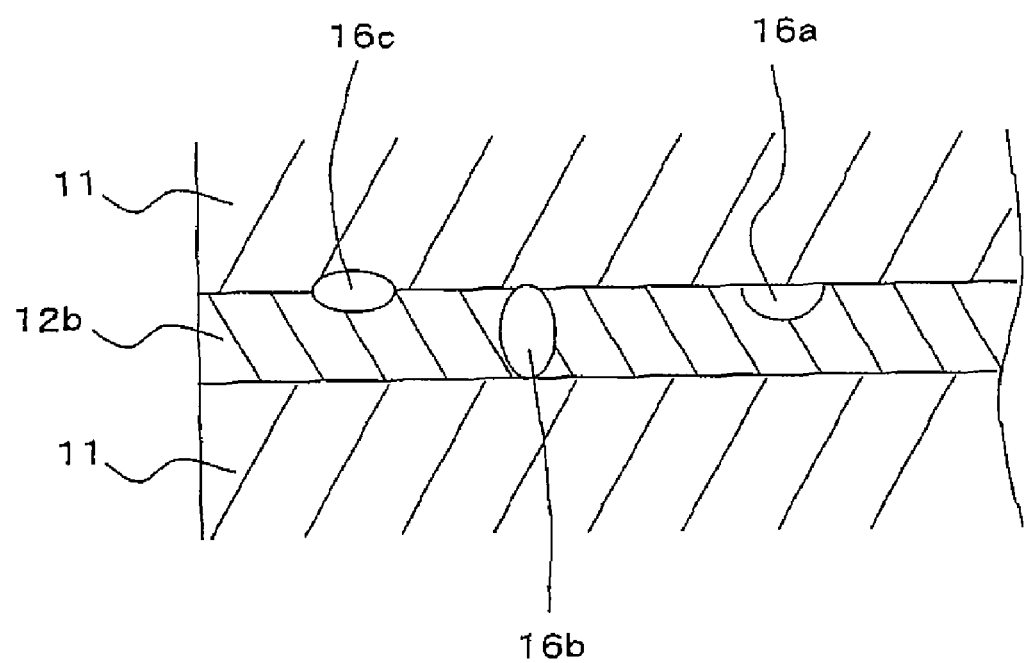
FIG. 3 is an enlarged sectional view of a part of FIG. 2.

That is, the multi-layer piezoelectric element of this embodiment is produced by a producing method which comprises: a step of forming a multi-layer compact by stacking green sheets which have piezoelectric ceramic as a main material and conductive paste layers which have metal as a main material and at least one nitride selected from a group consisting of titanium nitride and zirconium nitride alternately one on another; a step of firing the multi-layer compact. In the step of firing, a part or all of the nitride is oxidized to be oxide, which causes to expand the volume. After expanding the volume, since the oxide is absorbed into the piezoelectric ceramic, the hollows 16a or the apertures 16b are formed at the portions which were occupied by the oxide (FIG. 3). With this, a contact area between the internal electrode layer and the piezoelectric layer is decreased, thus lowering a restriction in which the internal electrode layer restricts the piezoelectric layer.

As aforementioned above, since the volume is expanded by the oxidation of the nitride, in some cases hollows are formed in the neighboring piezoelectric layer while forming the hollows 16a or the apertures 16b in the nitride containing internal electrode 12b. The hollow 16c is composed of the hollow 16a and the hollow formed at the place corresponding the hollow 16a in the piezoelectric layer.

Depending on firing temperature, all of the nitride is oxidized. In this case, while the hollows or apertures are formed on the interior electrode layer 12b, the nitride is not present in the interior electrode layer 12b. A part of the nitride remains without oxidization during firing, the unchanged nitride is present in or neighboring the hollows or apertures.

In the process of rising the firing temperature, the oxidization of the nitride start at a temperature in a range from 600° C. to 700° C. and most of the nitride is oxidized up to a temperature in a range from 900° C. to 1000° C. Therefore, it is preferable that the firing temperature is set 1000° C. or less, more preferably in a range from 850° C. to 950° C., further more preferably in a range from 900° C. to 950° C. to remain a part of the nitride in the interior electrode layer 12b.

When the sintering of the piezoelectric ceramic proceeds at a temperature more than the temperature that the oxidization is completed, in some cases the hollows or the apertures on the face opposite to the piezoelectric layer disappear. Therefore, it is preferable that the firing temperature is set 1000° C. or less, more preferably in a range from 850° C. to 950° C., further more preferably in a range from 850° C. to 900° C. to remain the hollows or the apertures.

Moreover, as plurality of nitride containing internal electrode layers 12b are provided in the stack 13, the amount of displacement of the element can also be controlled. This makes it possible to make a structure which is suited to mass production and does not require it to change the thickness of the piezoelectric layers 11 or change the number of layers stacked.

Composition of the internal electrode layers 12 can be determined as follows. The stack 13 is cut off along the interface between the internal electrode layer 12 and the piezoelectric layer 11 so as to expose the internal electrode layers 12, and a part of the internal electrode layers 12 is sampled. The sample is subjected to chemical analysis such as ICP (induction coupled plasma) emission analysis. A section of the multi-layer piezoelectric element cut in the stacking direction may also be analyzed by a method such as EPMA (Electron Probe Micro Analysis). It is possible to become clear whether a nitride or an oxide by analyzing an electron state of Ti or Zr using XPS: X-ray Photoelectron Spectorosscopy or ESCA: Electron Spectorosscopy of Chemical Analysis. Observation of the internal electrode layers in a section of the multi-layer piezoelectric element under an SEM (Scanning Electron Microscope) or a metallurgical microscope may reveal the existence of not only the metal component but also non-metallic component such as voids and/or ceramics. In such a case, too, the composition in a region other than the voids may be analyzed by EPMA or the like. Thus the compositions of the nitride containing internal electrode layers 12b and the other internal electrode layers 12a can be determined.

It is preferable that there are the plurality of the nitride containing internal electrode layers 12b. It is also preferable that the plurality of the nitride containing internal electrode layers 12b are disposed in an ordered arrangement along the stacking direction of the element. By disposing the nitride containing internal electrode layers 12b in an ordered arrangement, the stress acting on the multi-layer piezoelectric element can be effectively dispersed.

The phrase "the nitride containing internal electrode layers 12b are disposed in an ordered arrangement" means not only such a situation as equal number of the other internal electrode layers 12a are interposed in every space between the nitride containing internal electrode layers 12b, but also such a situation where different but approximate numbers of the other internal electrode layers 12a are interposed in different spaces between the nitride containing internal electrode layers 12b as long as the stress is not concentrated locally. Specifically, the number of the other internal electrode layers 12a interposed in every space between the nitride containing internal electrode layers 12b is preferably within ±20% of the mean number of the layers, more preferably within ±10% of the mean number of the layers, and furthermore preferably the number is the same in every space between the nitride containing internal electrode layers 12b. When the number of the other internal electrode layers 12a interposed in every space between the nitride containing internal electrode layers 12b is within the range described above, stress acting on the multi-layer piezoelectric element can be dispersed more effectively.

According to the present invention, it is preferable that the internal electrode layers 12 do not contain an insulating material, or the content of the insulating material is small. This makes it possible to increase the amount of piezoelectric displacement without generating a portion to which voltage cannot be applied in the piezoelectric layers 11 when the piezoelectric element is operated, and concentrating a stress to the portion of the insulating material can be suppressed.

It is preferable that the internal electrode layers 12 (12a, 12b) include voids. This is because presence of many voids in the internal electrode layers 12 makes it easier for the metal member to deform when subjected to stress, thereby dispersing and mitigating the stress. Presence of the voids also causes the piezoelectric layers 11 to be partially clamped when the piezoelectric layers 11 located in contact with the internal electrode layers 12 undergoes piezoelectric displacement. As a result, since the force of restricting the piezoelectric layers 11 becomes smaller than in the case of clamping over the entire surface, displacement becomes easier to occur and the amount of displacement increases.

It is particularly preferable that the internal electrode layers 12a include voids and the proportion of area of the voids included in the section of the internal electrode layers 12a to the total area of the section (void ratio) is in a range from 5 to 70%. The void ratio in the internal electrode layers 12a is more preferably from 7 to 70%, and furthermore preferably from 10 to 60%. By controlling the void ratio in the internal electrode layers 12a in the range from 5 to 70%, the piezoelectric layers 11 is enabled to deform smoothly while sufficient electrical conductivity of the internal electrode layers 12 can be maintained, so that the amount of displacement of the multi-layer piezoelectric element can be increased.

The void ratio can be determined by observing a section of the multi-layer piezoelectric element cut in the direction of stacking, by means of a scanning electron microscope or a metallurgical microscope. Specifically, by using an image of a section of the element captured by a scanning electron microscope or the like, the ratio of the area of all voids to the total area of the internal electrode layers is calculated. An image processing application available in the market may be used in this process. In a simpler method, a line may be drawn on the internal electrode layers 12 in a direction perpendicular to the stacking direction, and the sum of lengths of the line segments crossing the voids may be divided by the length of the entire line segment, to give the void ratio.

The nitride containing internal electrode layers 12b preferably has such a constitution as at least one nitride of TiN or ZrN is scattered in the internal electrode layers 12b. Specifically, the nitride containing internal electrode layers 12b preferably has such a constitution as a plurality of nitrides which have low wettability with the metal that constitutes the internal electrode layers 12b are scattered in the internal electrode layers 12b. With this constitution, even if cracks are generated between the nitride particles and the metal that constitutes the internal electrode layers 12b when the internal electrode layers 12b is subjected to stress generated during operation, the cracks are simply joined between the scattered nitride particles and growing cracks to penetrate the piezoelectric layers 11 can be suppressed. This enables the stress relieving effect and strength to coexist.

The stack 13 preferably has a prism shape which has a cross section of polygonal shape. In case the stack 13 has a cylindrical shape, layers formed in a shape of true circle with high precision must be stacked and it is difficult to improve the productivity of manufacturing. Polygonal prism configuration, in contrast, enables it to form the internal electrode layers 12 on the piezoelectric layer 11 having a predetermined datum line, and stack the layers in alignment with the datum line. As a result, the center axis can be formed as the axis of operation by a manufacturing method designed for mass production with high durability.

The internal electrode layers 12 are preferably formed mainly from silver-palladium. Silver-palladium and the nitride can be sintered at the same time since these materials have similar values of thermal expansion coefficients. Moreover, since silver-palladium and the nitride do not react with each other to form an intermetallic compound, the nitride particles are scattered in contact with each other in the silver-palladium so as the form the electrode.

Also because the silver-palladium forms liquid phase during sintering, it becomes easier for TiN and ZrN to disperse. As a trace of metals Ti and Zr dissociate from TiN and ZrN, the metal components Ti and Zr form metal bonding with silver-palladium. This enables mutual diffusion with silver-palladium, thus making it possible to sinter silver-palladium and a part of the TiN and ZrN particles which have formed metal bonding (portion of metal bonding between Ti, Zr and Ag—Pd).

In the nitride containing internal electrode layers 12b, since TiN and/or ZrN particles have low wettability with the metal that constitutes the internal electrode layers 12b, metals Ti and Zr are isolated in the internal electrode layers 12b if the metals do not dissociate from TiN and ZrN. In this case, only sliding motion between the nitride particles occurs in the internal electrode layers 12b when the multi-layer piezoelectric element is subjected to stress. In the meantime, as a trace of metals Ti and Zr dissociate so that silver-palladium and a part of the TiN and ZrN particles are sintered, the bonding is broken when subjected to the stress. The breaking point serves as the start point of crack growth, thus making it easier for the cracks to join with each other to form continuous cracks in the internal electrode layers 12b. This improves the effect of relieving the stress.

Nitrides such as BN other than TiN and ZrN have low wettability with the metal that constitutes the internal electrode layers 12 similarly to TiN and ZrN, although part thereof do not sinter with the metal particles, or it is not easy to do so. As a result, the stress relieving effect described above is hardly generated. Metals Ti and Zr are active to react with the metal (for example, silver-palladium) that constitutes the internal electrode layers 12. Therefore, even when these metals are turned into nitrides, active property of the metals Ti and Zr manifest itself in the unstable intermediate state where the metal component remains in part of the particles or the nitrides are being oxidized.

When TiN and ZrN are compared, TiN is preferably used since it can be sintered only in a part through diffusion bonding with the metal particles of the internal electrode layers 12 at a lower temperature.

The content of the nitrides in the nitride containing internal electrode layers 12b is preferably 1% by weight or more and not more than 80% by weight, more preferably 1% by weight or more and not more than 40% by weight, furthermore preferably 1% by weight or more and not more than 7% by weight, and most preferably 5% by weight or more and not more than 7% by weight.

As the content of the nitrides is controlled to 1% by weight or more, enough effects of stress relieving and increasing the amount of displacement described above can be achieved. At the same time, as the content of the nitrides is controlled to 80% by weight or less, it can be suppressed to decrease bonding strength between the nitride containing internal electrode layers 12b and the piezoelectric layer 11 too much, the multi-layer piezoelectric element can be ground or cut into any shape.

Also when the content of the nitrides is controlled to 40% by weight or less, thermal expansion characteristics of the nitride containing internal electrode layers 12b and the other internal electrode layers 12a can be made similar to each other. Accordingly, since bonding strength between the nitride containing internal electrode layers 12b and the piezoelectric layer 11 can be maintained at a certain level even when the multi-layer piezoelectric element is stored or operated in a harsh environment, stable operation of the multi-layer piezoelectric element can be achieved.

When the content of the nitrides is controlled to 1% by weight or more and not more than 7% by weight, the effect of absorbing and mitigating the stress through separation of TiN and/or ZrN from the surrounding metal particles and the effect of maintaining the bonding strength between the nitride containing internal electrode layers 12b and the piezoelectric layer 11 are well-balanced, and therefore very high durability can be achieved against the stress acting on the multi-layer piezoelectric element.

It is preferable that such a metal compound is contained as the main component in the internal electrode layer 12 that proportion M1 (% by weight) of palladium and proportion M2 (% by weight) of silver in the internal electrode layer 12 satisfy relationships of $0<M1\leq 15$, $85\leq M2<100$ and $M1+M2=100$. When the proportion of palladium is higher than 15% by weight, specific resistance becomes higher and the internal electrode layers 12 becomes more likely to generate heat when the multi-layer piezoelectric element is operated continuously, while the heat affects the piezoelectric layer 11 which has temperature dependency, thus deteriorating the displacement characteristic. As a result, the amount of displacement of the multi-layer piezoelectric element may decrease.

When the external electrodes 15 are formed, the external electrode 15 and the internal electrode layers 12 are joined together through mutual diffusion of metallic components between these members. In case the proportion of palladium is higher than 15% by weight, hardness of the portion of the external electrode 15 where the component of the internal electrode layers 15 is diffused becomes higher, thus resulting in lower durability of the multi-layer piezoelectric element that undergoes dimensional change during operation. In order to suppress silver contained in the internal electrode layers 12 from migrating into the piezoelectric layers 11, it is preferable to control the proportion of palladium in a range from 0.001 to 15% by weight. In order to improve the durability of the multi-layer piezoelectric element, proportion of palladium is preferably in a range from 0.1 to 10% by weight. When high heat conductivity and higher durability are required, proportion of palladium is preferably in a range from 0.5 to 9.5% by weight. When even higher durability is required, proportion of palladium is more preferably in a range from 2 to 8% by weight.

On the other hand, when the proportion of silver is less than 85% by weight, specific resistance of the internal electrode layers 12 becomes higher. This may lead to a significant amount of heat generated from the internal electrode layers 12 during continuous operation of the multi-layer piezoelectric element. In order to suppress silver contained in the internal electrode layers 12 from migrating into the piezoelectric layers 11, it is preferable to control the proportion of silver in a range from 85 to 99.999% by weight. In order to improve the durability of the multi-layer piezoelectric element, proportion of silver is preferably in a range from 90 to 99.9% by weight. When higher durability is required, proportion of silver is preferably in a range from 90.5 to 99.5% by weight. When even higher durability is required, proportion of silver is more preferably in a range from 92 to 98% by weight. Metal palladium and metal silver in the internal electrode layers 12 can be determined by EPMA or the like.

It is preferable that the piezoelectric layer 11 contains perovskite type oxide as the main component. When the piezoelectric layer 11 is formed from perovskite type piezoelectric ceramic material such as barium titanate ($BaTiO_3$), for example, it, has high piezoelectric strain constant $d_{33}$, an index of piezoelectric property, which enables it to increase the amount of displacement, and also enables the piezoelectric layers 11 and the internal electrode layers 12 to be fired at the same time. It is also preferable that the piezoelectric layer 11 contains perovskite type oxide consisting of lead titanate zirconate ($PbZrO_3$—$PbTiO_3$), that has a relatively high value of piezoelectric strain constant $d_{33}$, as the main component.

When the multi-layer piezoelectric element is used in an environment of high temperature and high humidity, the internal electrode layers 12b which contain at least one of TiN and ZrN change into titanium oxide or zirconium oxide, which is the main component of lead titanate zirconate, before the metal that constitutes the internal electrode layers 12 is oxidized. In this process, as the process of oxidization into stable $TiO_2$ or $ZrO_2$ deprives oxygen from the surrounding material, the metal components of the internal electrode layers 12 are reduced and the stable metal layer is maintained. The titanium oxide or zirconium oxide engages in mutual diffusion with lead titanate zirconate which is the component of the piezoelectric layer 11, so as to achieve the anchoring effect for firmly joining the piezoelectric layer 11 and the internal electrode layers 12 together. As a result, the multi-layer piezoelectric element having excellent resistance to environment can be made.

A method for manufacturing the piezoelectric element of the present invention will now be described. First, a calcined powder of a piezoelectric ceramic material constituted from perovskite type oxide consisting of $PbZrO_3$—$PbTiO_3$ or the like, a binder made of an organic polymer such as acrylic resin or butyral resin and a plasticizer such as DBP (dibutyl phthalate) or DOP (dioctyl phthalate) are mixed so as to form a slurry. The slurry is formed into ceramic green sheets, which would become the piezoelectric layers 11 after firing, by a known method such as doctor blade process or calender roll process or other tape molding method.

Then a metal powder such as silver-palladium that constitutes the internal electrode layers 12, a binder and a plasticizer are mixed to prepare an electrically conductive paste which is applied onto the top surface of the green sheets by screen printing method or the like to a thickness of 1 to 40 μm.

The electrically conductive paste used to form the nitride containing internal electrode layers 12b is prepared by mixing a metal powder such as silver-palladium, at least one of nitrides TiN and ZrN, a binder and a plasticizer.

In this case, the metal powder such as silver-palladium may also be a mixture of silver powder and palladium powder of controlled proportions, rather than the alloy powder. Silver powder or palladium powder may also be added to the powder of silver-palladium alloy, with the composition of the mixture being controlled thereafter. However, it is preferable to use alloy powder controlled to predetermined composition, in order to make uniform dispersion of the metals in the paste and uniform composition within the same plane of the internal electrode layers 12.

A plurality of the green sheets having the electrically conductive paste printed thereon are stacked one on another in the desired arrangement, and the stack is heated at a predetermined temperature to remove the binder. The stack is then fired at a temperature in a range from 900 to 1200° C. thereby to make the stack 13.

When the metal powder such as silver-palladium that constitutes the internal electrode layers 12 is added to the green sheet that forms the inactive layer 14, or a slurry consisting of the metal powder such as silver-palladium that constitutes the internal electrode layers 12, an inorganic compound, a binder and a plasticizer is printed on the green sheets when the green sheets that form the inactive layer 14 are stacked, shrinking behavior and shrinking rate can be matched between the inactive layer 14 and the other portions during sintering, thus making it possible to form the stack 13 of high density.

The method of making the stack 13 is not limited to that described above, and any manufacturing method may be employed as long as the stack 13 can be made in such a constitution as a plurality of the piezoelectric layers 11 and a plurality of the internal electrode layers 12 are stacked alternately one on another.

Then an electrically conductive silver-glass paste is prepared by adding a binder to a glass powder, and the paste is printed on the external electrode forming surface of the stack 13, and the stack is baked at a temperature that is higher than the softening point of the glass and is not higher than the melting point of silver (965° C.). Thus the external electrode 15 is formed from the electrically conductive silver-glass paste.

At this time, the paste that constitutes the external electrode 15 may be applied in multiple layers and then baked at once, or a single layer may be baked. For the reason of convenience in mass production, it is preferable that multiple layers are formed and then baked at once. When the layers having different contents of the glass component are to be formed, the layers may be formed while varying the quantity of the glass component contained in each layer one by one. When it is necessary to form a very thin glass-rich layer in contact with the piezoelectric layer 11, a glass-rich paste may be printed on the stack 13 by screen printing process or the like, and the multiple sheets may be stacked thereon.

Last, lead wires are connected to the external electrodes 15. Through the lead wires, DC voltage of 0.1 to 3 kV/mm is applied between the pair of external electrodes 15 so as to apply polarization treatment to the stack 13, thereby to complete a multi-layer piezoelectric actuator which uses the multi-layer piezoelectric element of the present invention. When the lead wires are connected to an external voltage source and the voltage is applied via the lead wires and the external electrodes 15 to the internal electrodes 12, the piezoelectric layers 11 undergo a significant amount of displacement by the reverse piezoelectric effect, so as to drive, for example, an automobile fuel injection apparatus that supplies fuel to an engine.

A wiring comprising mesh- or comb-shaped metal may be joined onto the outer surface of the external electrodes 15 by means of an electrically conductive adhesive. Such a wiring allows it to flow a large current in the vicinity of the internal electrode and decrease the current flowing in the external electrodes 15, when the actuator is operated at a high speed by supplying a large current. Accordingly, it is made possible to suppress wire breakage due to local heating of the external electrodes 15, thus greatly improving the durability.

The electrically conductive particles are more preferably non-spherical particles having such shapes as flakes or acicular particles. When the electrically conductive particles are non-spherical particles such as flakes or acicular particles, the electrically conductive particles can be firmly entwined with each other, thereby increasing the shear strength of the electrically conductive adhesive.

One embodiment of the present invention has been described, although the multi-layer piezoelectric element of the present invention is not limited to the embodiment described above, and various modifications can be made without departing from the spirit of the present invention.

For example, while all the internal electrode layers are made of an alloy in the embodiment described above, such a constitution may also be employed as part of the internal electrode layers are formed from an alloy and the rest is formed from a metal element. While the internal electrode layers contain the same components in the embodiment described above, the internal electrode layers may also consist of layers of two or more kinds which contain different elements as the main components.

<Injection Apparatus>

Figure 4:
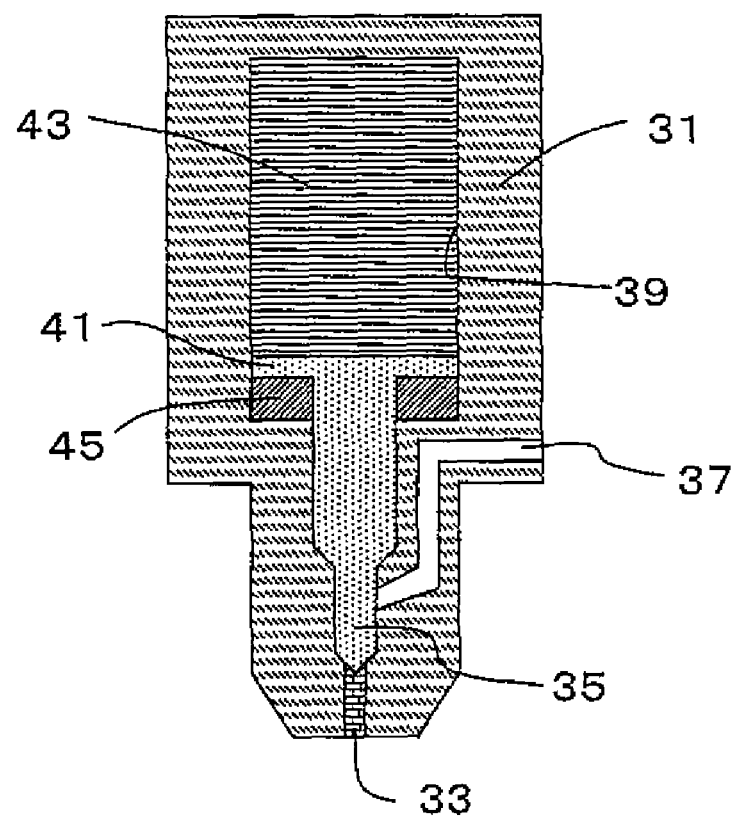
FIG. 4 is a sectional view schematically showing an injection apparatus according to one embodiment of the present invention.
Figure 5A:
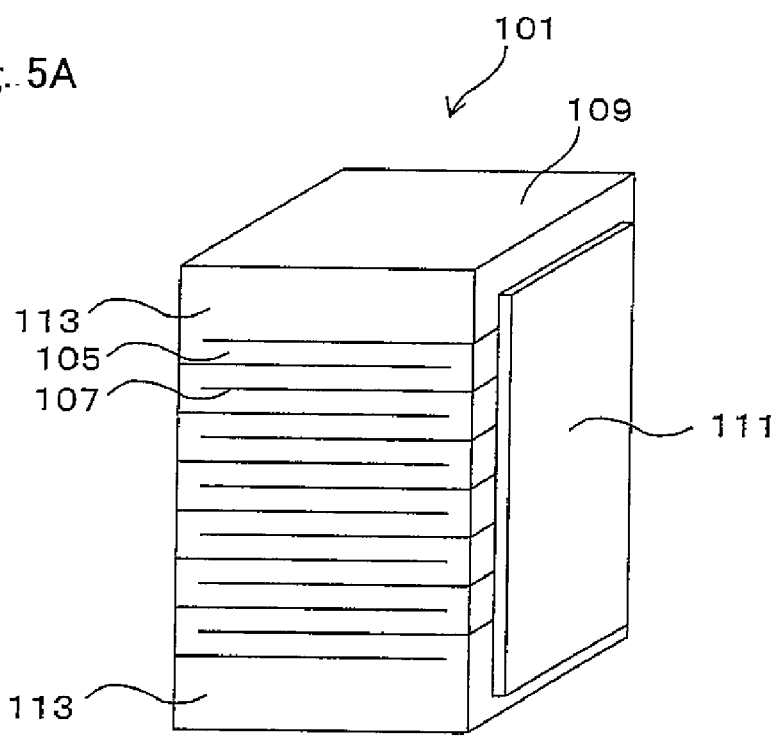
FIG. 5A is a perspective view of a multi-layer piezoelectric element of the prior art.
Figure 5B:
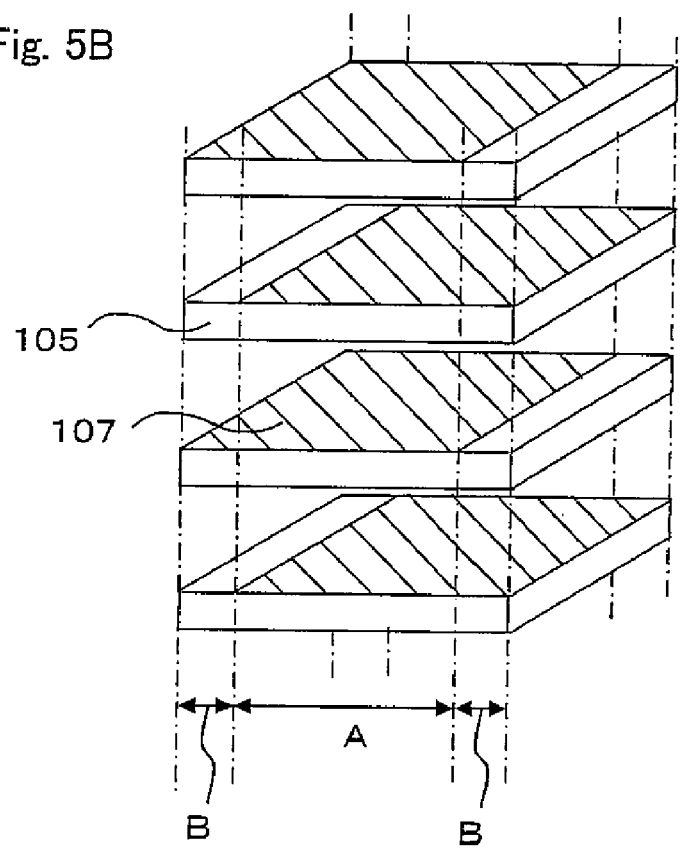
FIG. 5B is a partial perspective view showing the piezoelectric layers and the internal electrode layers stacked one on another.

FIG. 4 is a sectional view schematically showing an injection apparatus according to one embodiment of the present invention. As shown in FIG. 4, the injection apparatus of this embodiment comprises a multi-layer piezoelectric element of the present invention exemplified by the embodiment described above being housed in a container 31 which has an injection hole 33 formed at one end thereof. Disposed in the container 31 is a needle valve 35 which is capable of opening and closing the injection hole 33. The injection hole 33 is provided with a fuel passage 37 disposed so as to communicate therewith in accordance to the movement of the needle valve 35. The fuel passage 37 is connected to a fuel source that is provided outside of the apparatus, so as to receive a fuel supplied thereto at a high pressure that remains always constant. When the needle valve 35 opens the injection hole 33, the fuel that fills the fuel passage 37 is injected into a fuel chamber of an internal combustion engine which is not shown in the drawing.

The needle valve 35 has an enlarged top portion where the inner diameter is made larger. A cylinder 39 formed in the container 31 are a piston 41 which can make sliding motion are provided. Disposed in the container 31 is a piezoelectric actuator 43 provided with the multi-layer piezoelectric element described above.

In such an injection apparatus, when the piezoelectric actuator 43 expands in response to a voltage applied thereto, the piston 41 is pressed so that the needle valve 35 plugs the injection hole 33, thereby stopping the supply of fuel. When the voltage is removed, the piezoelectric actuator 43 shrinks and a Belleville spring 45 pushes back the piston 41, so that the injection hole 33 communicates with the fuel passage 37 and the fuel is discharged.

The present invention relates to the piezoelectric actuator unit, although the present invention is not limited to the embodiment described above, and various modifications can be made without departing from the spirit of the present invention. The piezoelectric actuator unit of the present invention can be used in, for example, the fuel injection apparatus of an automobile engine, liquid injection apparatus of an ink jet printer or the like or a drive unit used in precision positioning device or vibration preventing device for an optical apparatus, sensor element mounted in combustion pressure sensor, knocking sensor, acceleration sensor, load sensor, ultrasound sensor, pressure sensor, yaw rate sensor or the like, or used as a circuit component mounted in piezoelectric gyro, piezoelectric switch, piezoelectric transducer, piezoelectric breaker or the like, as long as the piezoelectric property is utilized.

EXAMPLES

A piezoelectric actuator comprising the multi-layer piezoelectric element of the first embodiment was made as follows.

First, a calcined powder of a piezoelectric ceramic material constituted from lead titanate zirconate ($PbZrO_3$—$PbTiO_3$) having a mean particle size of 0.4 μm as the main component, a binder and a plasticizer were mixed to form a slurry which was formed into ceramic green sheets having thickness of 100 μm after firing by the doctor blade, process.

An electrically conductive paste, prepared by adding a binder to the alloy consisting mainly of silver-palladium so as to have the composition shown in Table 1, was applied to one side of the ceramic green sheet by screen printing method. Then 300 pieces of the ceramic green sheets were stacked and fired at a temperature of 1000° C. for 2 hours after holding the temperature at 800° C. for 2 hours.

At this time, on a portion where the internal electrode layers 12b which contains at least one of TiN and ZrN was to be formed, an electrically conductive paste, prepared by adding TiN, ZrN and a binder to the silver-palladium alloy so as to have the composition shown in Table 1, was printed to a thickness of 3 μm, and the internal electrode layers 12b containing at least one of TiN and ZrN was disposed as the $50^{th}$ layer, $100^{th}$ layer, $150^{th}$ layer, $200^{th}$ layer and $250^{th}$ layer.

Then a mixture of silver powder of flake-like particles having a mean particle size of 2 μm and amorphous glass powder having softening point of 640° C. containing silicon having a mean particle size of 2 μm as the main component was mixed with 8 weight parts of binder in proportion to 100 weight parts in total of silver powder and glass powder, so as to prepare the electrically conductive silver-glass paste by fully mixing the powders. The electrically conductive silver-glass paste thus prepared was printed onto to external electrodes 15 of the stack 13, and was baked at 700° C. for 30 minutes thereby to form the external electrodes 15.

Then with lead wires connected to the external electrodes 15, a DC electric field of 3 kV/mm was applied between the positive and negative external electrodes 15 via the lead wires for 15 minutes so as to apply polarization treatment, thereby completing the piezoelectric actuator using the multi-layer piezoelectric element as shown in FIGS. 1A, 1B.

When a DC voltage of 150 V was applied to the multi-layer piezoelectric element, all piezoelectric actuators showed displacements in the stacking direction.

Then an AC voltage of 150 Hz from 0 to +150 V was applied to the piezoelectric actuator unit at the room temperature, to carry out continuous operation test of $1 \times 10^9$ cycles.

The test results are shown in Table 1.

TABLE 1

| No. | Composition of internal electrode layer 12a (% by weight) | Composition of internal electrode layer containing nitrogen (% by weight) | Displacement in initial state (μm) | Displacement after continuous operation of $1 \times 10^9$ cycles (μm) | Crack which penetrated piezoelectric layer |
|---|---|---|---|---|---|
| 1 | Ag 70% Pd 30% | Ag 68.6% Pd 29.4% TiN 2.0% | 45.0 | 44.9 | not occurred |
| 2 | Ag 70% Pd 30% | Ag 66.6% Pd 28.6% ZrN 4.8% | 44.5 | 44.4 | not occurred |
| 3 | Ag 80% Pd 20% | Ag 76.2% Pd 19.0% TiN 4.8% | 50.0 | 49.9 | not occurred |
| 4 | Ag 80% Pd 20% | Ag 74.8% Pd 18.7% ZrN 6.5% | 49.5 | 49.4 | not occurred |
| 5 | Ag 90% Pd 10% | Ag 89.1% Pd 9.9% TiN 1.0% | 55.0 | 55.0 | not occurred |
| 6 | Ag 90% Pd 10% | Ag 85.7% Pd 9.5% TiN 4.8% | 54.5 | 54.4 | not occurred |
| 7 | Ag 95% Pd 5% | Ag 90.4% Pd 4.8% TiN 4.8% | 60.0 | 60.0 | not occurred |
| 8 | Ag 80% Pd 20% | Ag 76.2% Pd 19.0% BN 4.8% | 45.0 | 20.0 | occurred |
| 9 | Ag 80% Pd 20% | — | 45.0 | 15.0 | occurred |

As shown in Table 1, in sample No. 8 in which BN was added as a nitride other than TiN and ZrN and in sample No. 9 in which nitride was not added, made as Comparative Example, the amount of displacement was small due to crack which penetrated the piezoelectric layer interposed between the internal electrode layers. This is supposedly because the crack occurred only in the internal electrode layers and made it impossible to mitigate the stress, thus resulting in concentration of the stress in the interface between the internal electrode layers and the piezoelectric layer.

Samples Nos. 1 to 8 made as Example of the present invention, in contrast, showed effective amount of displacement required for a piezoelectric actuator without significant decrease in the amount of displacement after continuous operation of $1\times10^9$ cycles, and piezoelectric actuator having high durability was made.

The invention claimed is:

1. A method of producing a multi-layer piezoelectric element comprising:

forming a multi-layer compact by stacking green sheets each having piezoelectric ceramic as a main material and conductive paste layers each having metal as a main material alternately one on another;

firing the multi-layer compact;

wherein the conductive paste layers contain silver-palladium as a main component and at least one of the conductive paste layers contain at least one nitride selected from a group consisting of titanium nitride and zirconium nitride, the content of the nitrides being controlled to 1% by weight or more and not more than 7% by weight.

2. The method of producing a multi-layer piezoelectric element according to claim 1, wherein all of the nitride is oxidized to be oxide.

* * * * *

UNITED STATES PATENT AND TRADEMARK OFFICE
CERTIFICATE OF CORRECTION

PATENT NO. : 8,196,843 B2  
APPLICATION NO. : 12/532606  
DATED : June 12, 2012  
INVENTOR(S) : Takami Sakamoto et al.

It is certified that error appears in the above-identified patent and that said Letters Patent is hereby corrected as shown below:

On the Title Page:

Item (73) Assignee: "Siemens Aktiengesellschaft, Munich (DE)" should be replaced with new Assignee "Continental Automotive GMBH, Hanover (DE)"

Signed and Sealed this  
Seventh Day of May, 2013

Teresa Stanek Rea  
*Acting Director of the United States Patent and Trademark Office*